(12) United States Patent
Huang et al.

(10) Patent No.: US 9,515,032 B1
(45) Date of Patent: Dec. 6, 2016

(54) HIGH-FREQUENCY PACKAGE

(71) Applicant: WIN Semiconductors Corp., Tao Yuan (TW)

(72) Inventors: Chih-Wen Huang, Taoyuan (TW); Yu-Chiao Chen, Taipei (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 14/882,412

(22) Filed: Oct. 13, 2015

Related U.S. Application Data

(60) Provisional application No. 62/204,972, filed on Aug. 13, 2015.

(51) Int. Cl.
| | |
|---|---|
| *H01L 23/495* | (2006.01) |
| *H01L 23/66* | (2006.01) |
| *H01L 23/00* | (2006.01) |

(52) U.S. Cl.
CPC ......... *H01L 23/66* (2013.01); *H01L 23/49503* (2013.01); *H01L 23/49541* (2013.01); *H01L 24/49* (2013.01); *H01L 2223/6611* (2013.01); *H01L 2224/48247* (2013.01); *H01L 2924/30107* (2013.01)

(58) Field of Classification Search
CPC ............... H01L 23/49541; H01L 23/49805; H01L 23/50; H01L 23/66
USPC ........................................ 257/691
See application file for complete search history.

(56) References Cited

U.S. PATENT DOCUMENTS

| | | | |
|---|---|---|---|
| 5,057,805 A * | 10/1991 | Kadowaki | H01L 23/49541 174/536 |
| 5,677,570 A | 10/1997 | Kondoh | |
| 5,932,927 A | 8/1999 | Koizumi | |
| 6,239,669 B1 | 5/2001 | Koriyama | |
| 6,642,808 B2 | 11/2003 | Koriyama | |
| 6,661,101 B2 * | 12/2003 | Hiraga | H01L 23/49805 257/691 |
| 6,828,658 B2 | 12/2004 | Schmitz | |
| 6,936,921 B2 | 8/2005 | Yoshida | |
| 7,187,256 B2 | 3/2007 | Oran | |
| 7,211,887 B2 | 5/2007 | Channabasa | |
| 7,489,022 B2 | 2/2009 | Torkington | |
| 8,044,496 B2 | 10/2011 | Hsieh | |
| 8,912,664 B1 | 12/2014 | Liou | |
| 8,987,063 B2 | 3/2015 | Harata | |
| 8,999,755 B1 | 4/2015 | Liu | |
| 2005/0184825 A1 | 8/2005 | Oran | |
| 2012/0208324 A1 | 8/2012 | Harata | |
| 2014/0036471 A1 | 2/2014 | Yuen | |

FOREIGN PATENT DOCUMENTS

TW          200625585          7/2006

* cited by examiner

*Primary Examiner* — Cuong Q Nguyen
(74) *Attorney, Agent, or Firm* — Winston Hsu; Scott Margo

(57) ABSTRACT

A high-frequency package comprises a ground lead, connected to a die, occupying a side of the high-frequency package, wherein a slot is formed within the ground lead; and a signal lead, connected to the die, disposed within the slot; wherein the ground lead surrounds the signal lead, and the ground lead and the signal lead form as a ground-signal-ground structure.

7 Claims, 7 Drawing Sheets

HIGH-FREQUENCY PACKAGE

CROSS REFERENCE TO RELATED APPLICATIONS

This application claims the benefit of U.S. provisional application No. 62/204,972, filed on Aug. 13, 2015 and incorporated herein by reference.

BACKGROUND OF THE INVENTION

1. Field of the Invention

The present invention relates to a high-frequency package, and more particularly, to a high-frequency package capable of reducing high-frequency loss.

2. Description of the Prior Art

Future mobile communication systems and satellite communication systems are usually required to operate at high frequencies. However, a traditional package causes significant loss at high frequencies, and degrades performance of the package. Specifically, in the tradition package process, a wire bonding process is performed to connect a die with leads via bonding wires. After the wires are bonded, a molding process is performed. Since the molding compound is usually made of a lossy material, an inductive effect is formed and a serious loss at high frequencies is caused.

For example, please refer to FIGS. 1A-1C, which are schematic diagrams of a sectional side view, a top view and a bottom view of a package 10 in the prior art. In the package 10, a die 100 is bonded on a die pad 102 and connect to a plurality of leads 104 via bonding wires 106. The bonding wires 106 and the leads 104 would be covered by a molding compound after the molding process, and thus, inductance is formed around the bonding wires 106 and the leads 104, which causes serious loss at high frequencies.

Therefore, it is necessary to improve the prior art.

SUMMARY OF THE INVENTION

It is therefore a primary objective of the present invention to provide a high-frequency package capable of reducing high-frequency loss, to improve over disadvantages of the prior art.

The present invention discloses a high-frequency package. The high-frequency package comprises a ground lead, connected to a die, occupying a side of the high-frequency package, wherein a slot is formed within the ground lead; and a signal lead, connected to the die, disposed within the slot; wherein the ground lead surrounds the signal lead, and the ground lead and the signal lead form as a ground-signal-ground structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
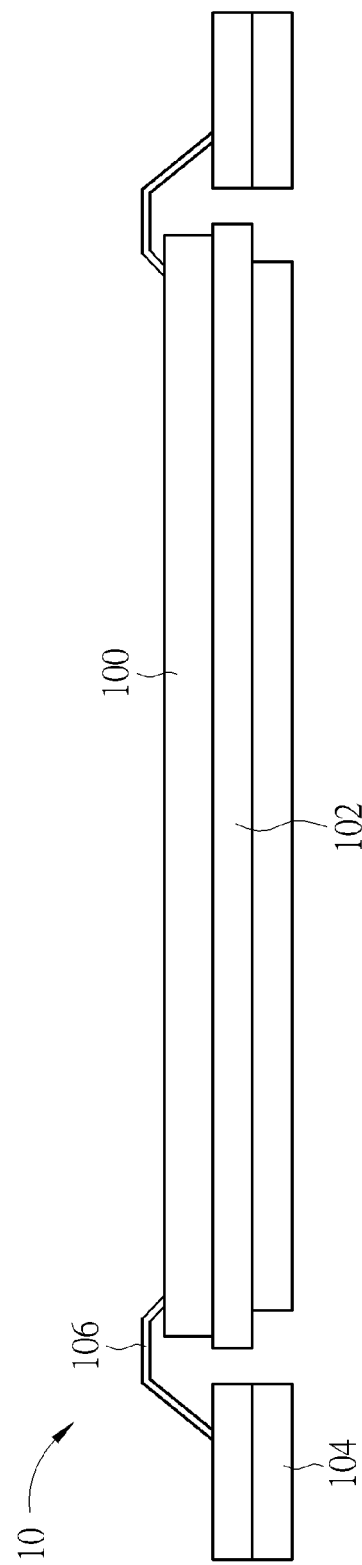
FIGS. 1A-1C are schematic diagrams of a sectional side view, a top view, and a bottom view, respectively, of a package in the prior art.
Figure 1B:
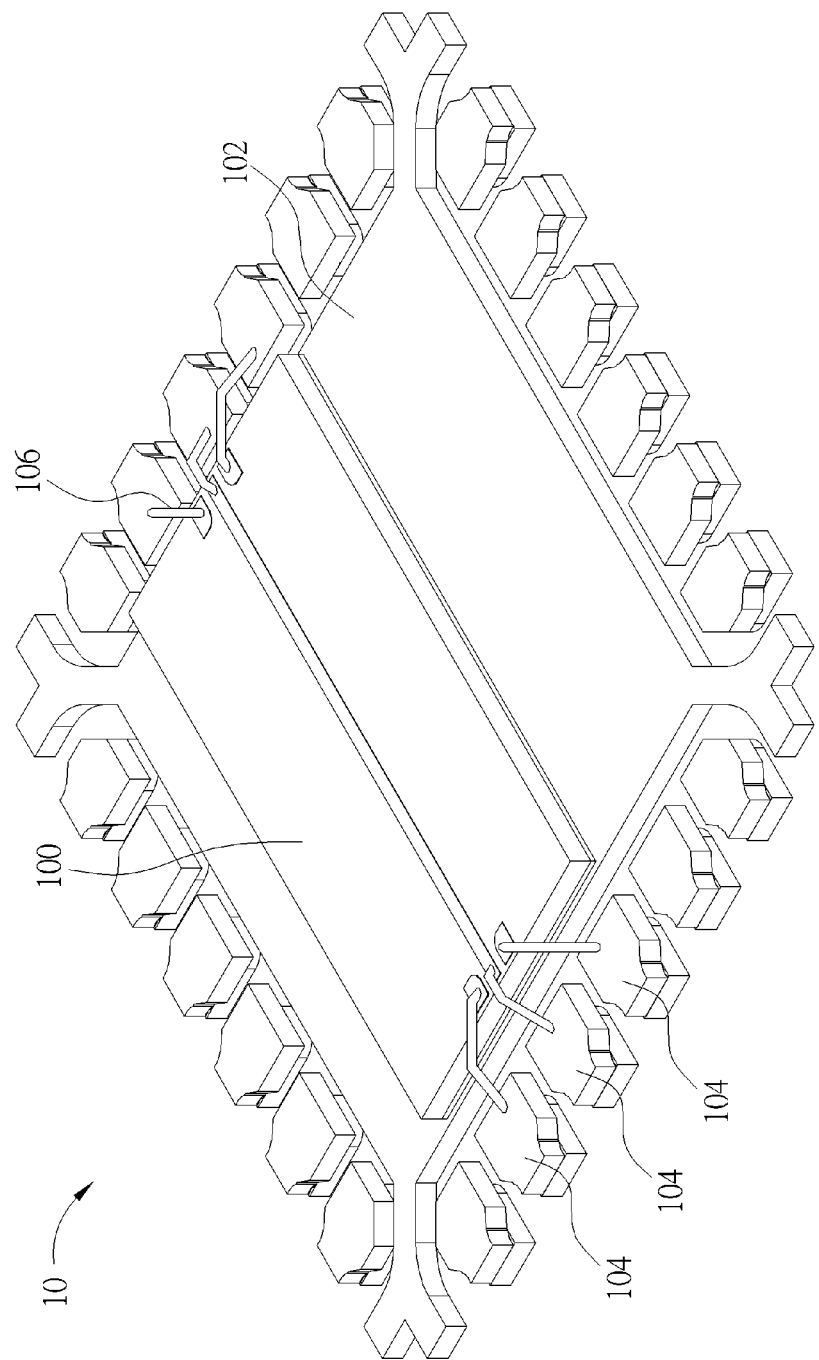
Figure 1C:
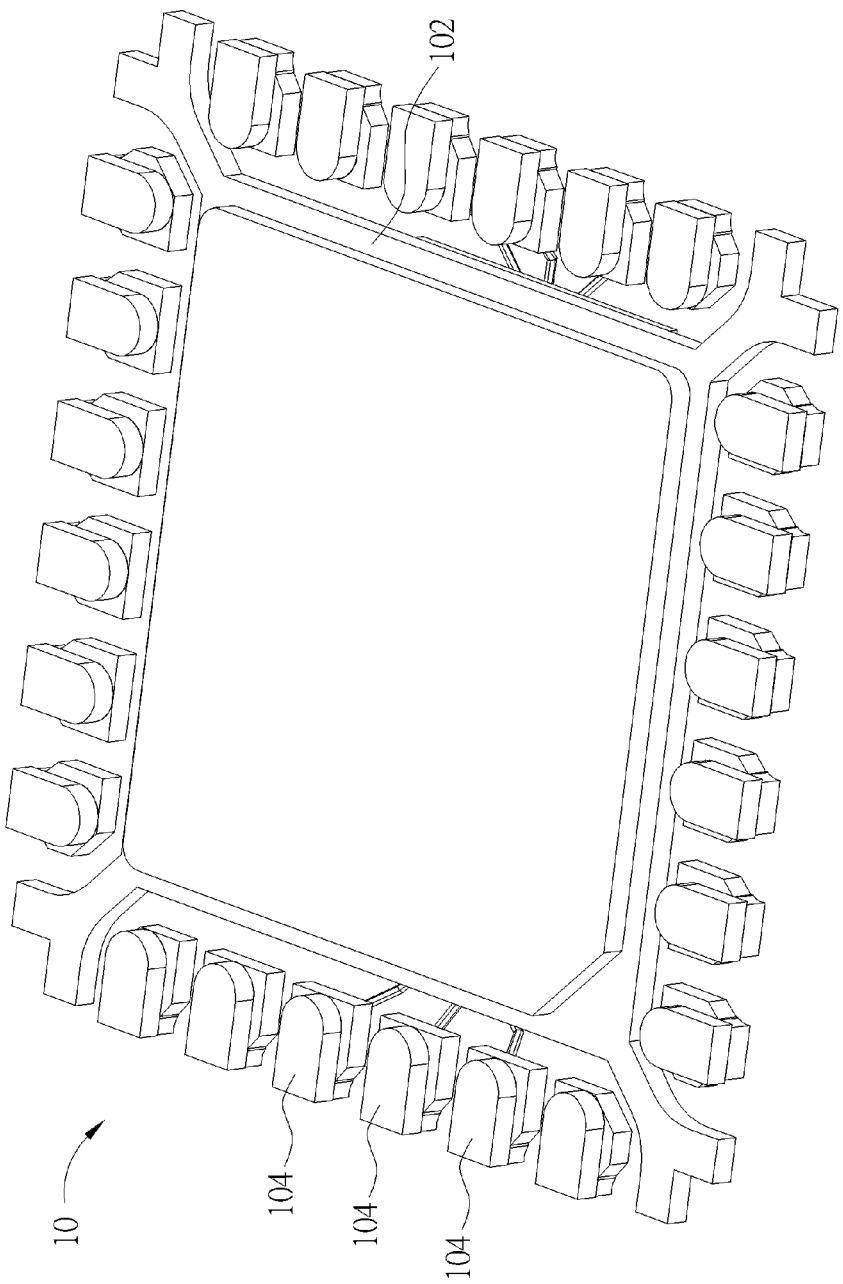
Figure 2:
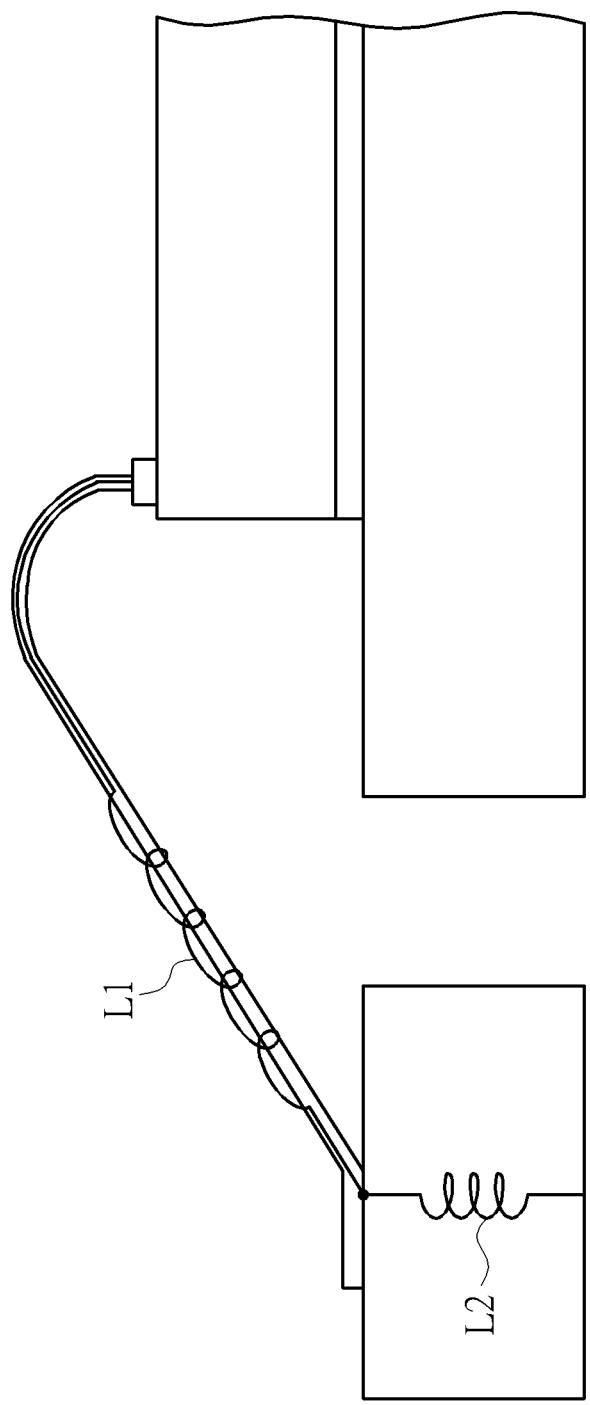
FIG. 2 is a schematic diagram of a circuit model

Inductance formed around the bonding wires and the leads is illustrated in FIG. 2, a schematic diagram of a circuit model of a package. In FIG. 2, an inductance $L1$ represents an inductance around the bonding wires, and an inductance $L2$ represents an inductance around the leads. Reducing either the inductance $L1$ or the inductance $L2$ would alleviate loss and enhance package performance at high frequencies.

Figure 3A:
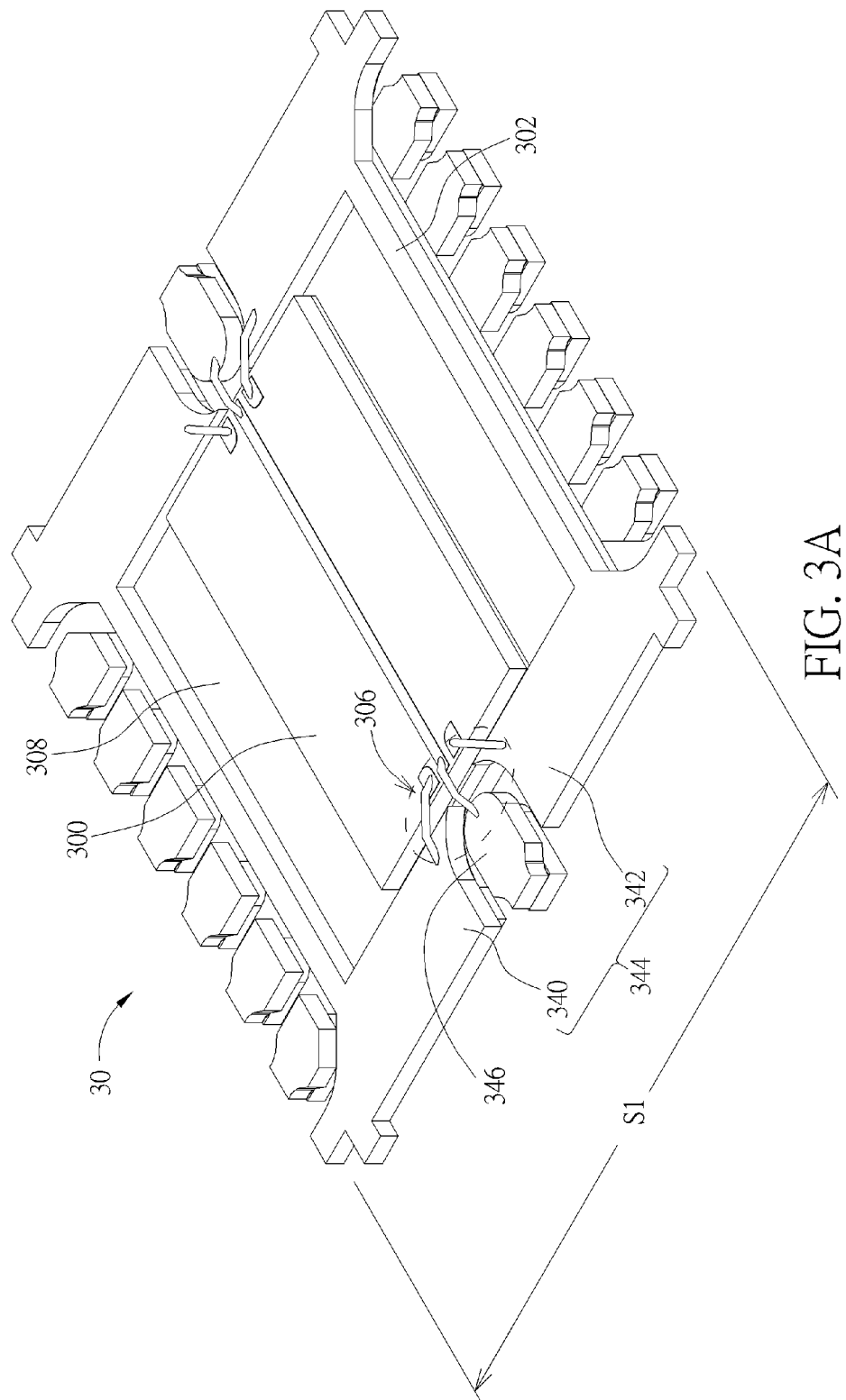
FIGS. 3A and 3B are schematic diagrams of a top view and a bottom view, respectively, of a high-frequency package according to an embodiment of the present invention.

To reduce the inductance $L2$ around the leads, the leads are designed as transmission lines. Please refer to FIGS. 3A and 3B, which are schematic diagrams of a top view and a bottom view of a high-frequency package 30 according to an embodiment of the present invention. The high-frequency package 30 comprises a signal lead 346 and a ground lead 344, disposed on a side S1 of the high-frequency package 30. The signal lead 346 and the ground lead 344 are designed (perform) as transmission lines. The signal lead 346 is connected to a die 300 via bonding wires 306 and configured to deliver a signal of the die 300. The ground lead 344 occupies the entire side S1 of the high-frequency package 30, and is connected to a ground of the die 300 via the bonding wires 306. A slot is formed within the ground lead 344, and the signal lead 346 is disposed within the slot, such that the ground lead 344 surrounds the signal lead 346 and is separated from the signal lead 346. Utilizing the signal lead 346 and the ground lead 344 to perform as transmission line would effectively reduce the inductance $L2$ around the leads and enhance performance of the high-frequency package 30 at high frequencies. Furthermore, the ground lead 344, connected to the ground of the die 300, is maintained at a fixed ground voltage. Therefore, the ground lead 344 and the signal lead 346 form as a ground-signal-ground (GSG) structure of transmission line, which enhances performance of the high-frequency package 30 at high frequencies. Furthermore, the bonding wire 306 connecting the die 300 and the ground lead 344 is disposed between the bonding wires 306 connecting the die 300 and the signal lead 346, which means that the bonding wires 306 also form as a GSG structure so as to enhance the high-frequency performance of the high-frequency package 30.

In addition, the ground lead 344 may comprise ground segments 340, 342. The ground segments 340, 342, separated with each other by the slot, surround the signal lead 346. The ground segments 340, 342 are also connected to the ground of the die 300, such that the ground segments 340, 342 are maintained at the fixed ground voltage to form the GSG structure. Preferably, a top surface of the ground lead 344 and a top surface of the signal lead 346 are at a same horizontal level. That is, the top surface of the ground lead 344 is coplanar (or aligned) with the top surface of the signal lead 346. In such a situation, a radiation of the signal lead 346 would be stabilized, which enhances high-frequency performance of the high-frequency package 30.

Figure 3B:
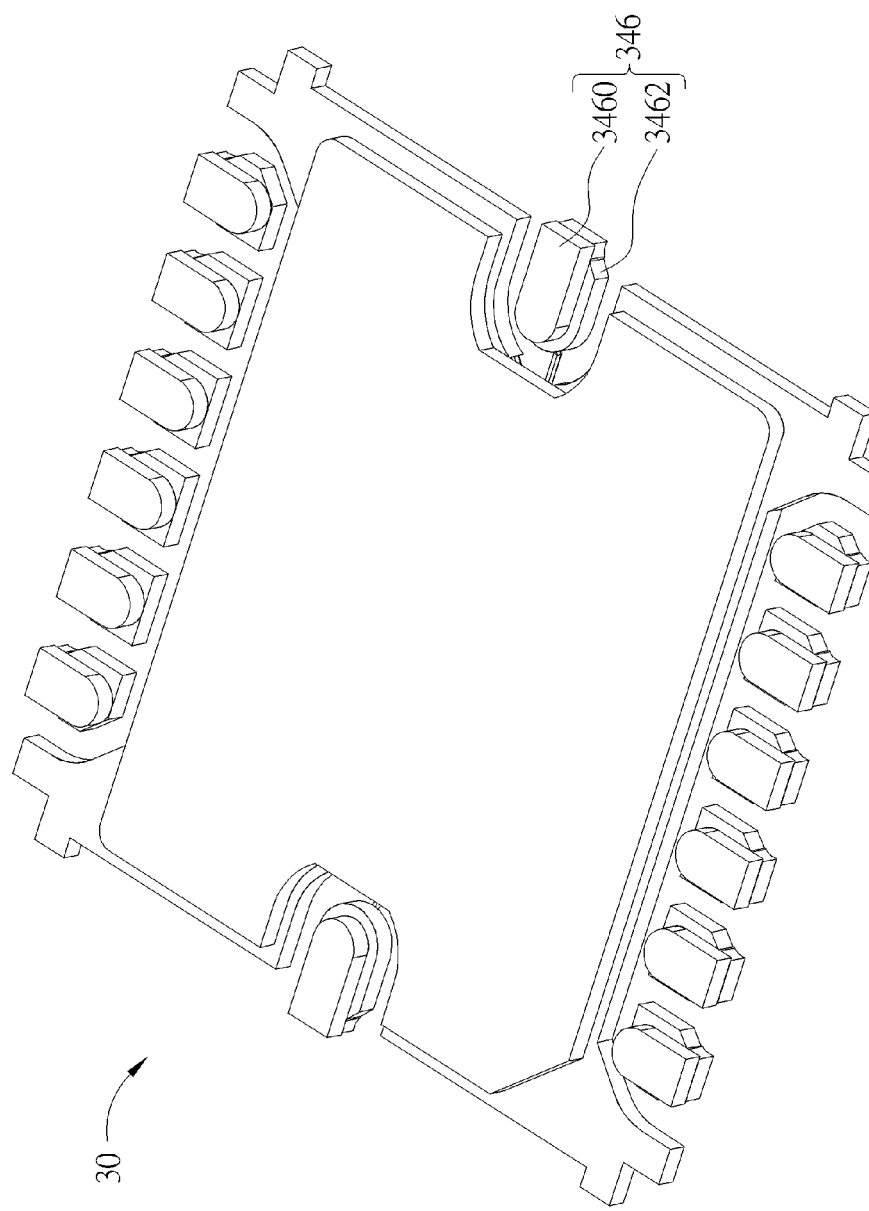

In addition, as FIG. 3B shows, the signal lead 346 comprises an upper signal portion 3462 and a lower signal portion 3460. The lower signal portion 3460 has a narrower area than the upper signal portion 3462, such that the molding compound may have a better catching capability on the signal lead 346 after the molding process is performed.

Preferably, a notched area 308 may be formed on a die pad 302 of the high-frequency package 30. The die 300 may be disposed on the die pad 302, such that a top surface of the die 300 is substantially coplanar with the top surfaces of the ground lead 344 and the signal lead 346. In such a situation, the bonding wires 306 are shortened and the inductance L1 is reduced, which enhances the high-frequency performance of the high-frequency package 30.

As can be seen, the high-frequency package of the present invention utilizes the signal lead and the ground lead to perform as transmission line, where the ground lead surrounds the signal lead and the GSG structure of transmission line is formed. Thus, performance of the high-frequency package is improved.

Figure 4:
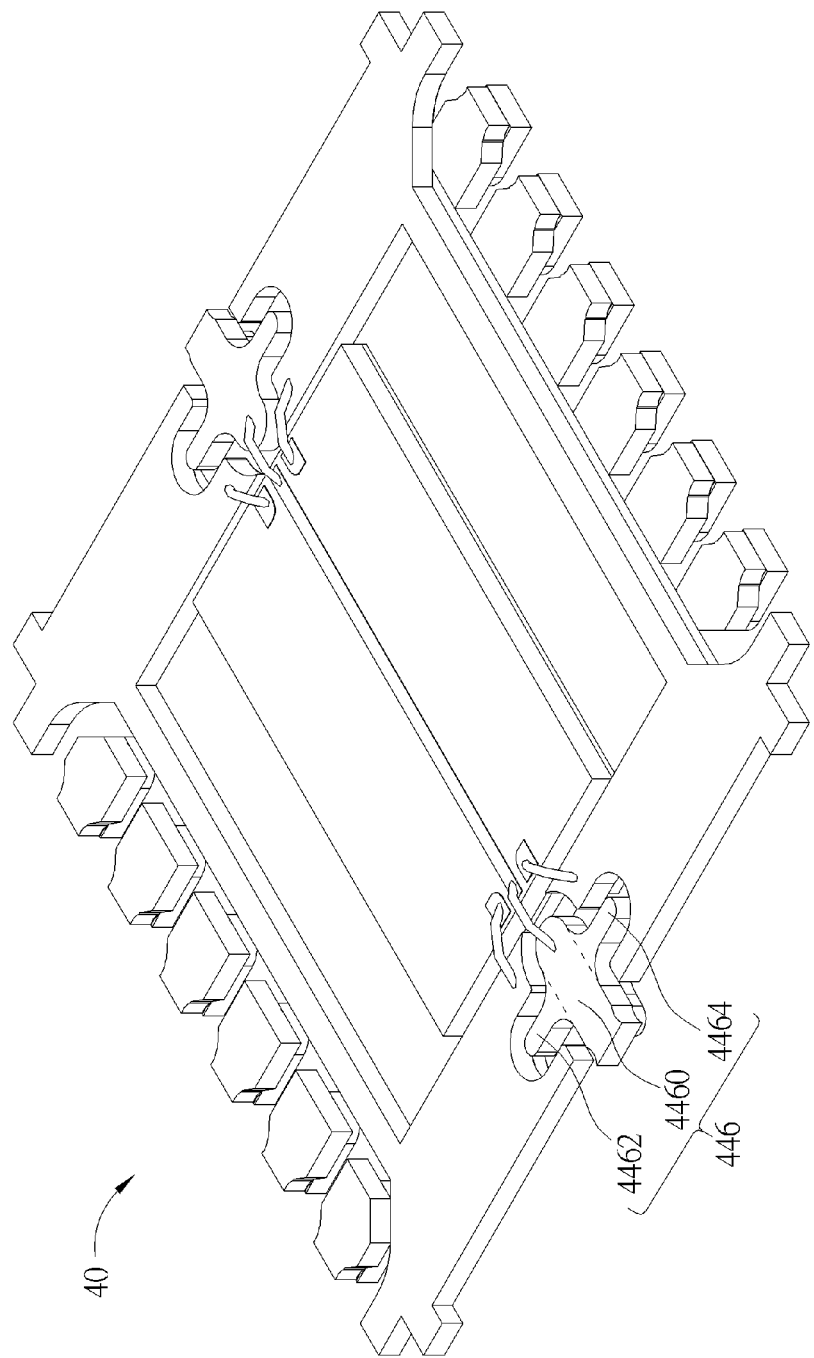
FIG. 4 is a schematic diagram of a top view of a high-frequency package according to an embodiment of the present invention.

In addition, a shape of the signal lead is not limited. The shape of the signal lead may be modified according to the practical situation. For example, please refer to FIG. 4, which is a schematic diagram of a top view of a high-frequency package 40 according to an embodiment of the present invention. A signal lead 446 of the high-frequency package 40 may comprise protrusions 4462, 4464. The protrusions 4462, 4464 protrude from a central portion 4460 of the signal lead 446. The protrusions 4462, 4464 may form a capacitance effect of transmission line, which may compensate the inductance effect of the high-frequency package 40 and further enhance the high-frequency performance of the high-frequency package 40.

Notably, the embodiments stated in the above are utilized for illustrating the concept of the present invention. Those skilled in the art may make modifications and alternations accordingly, and not limited herein. For example, the signal lead and the ground lead may be realized using microstrip line or coplanar waveguide, and not limited herein. In addition, methods of forming the notched area are not limited. The notched area is formed by either topside etching or backside etching, and not limited herein. In addition, a number of the protrusions of the signal lead is not limited. A signal lead comprising only one protrusion is still within the scope of the present invention.

In summary, the high-frequency package of the present invention utilizes the signal lead and the ground lead to perform as transmission line, where the ground lead surrounds the signal lead so as to form the GSG structure of transmission line. Thus, performance of the high-frequency package is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-frequency package, comprising:
    a ground lead, connected to a ground of a die, occupying an entire side of the high-frequency package, wherein a slot is formed within the ground lead; and
    a signal lead, connected to the die, disposed within the slot;
    wherein the ground lead surrounds the signal lead, and the ground lead and the signal lead form as a ground-signal-ground structure.

2. The high-frequency package of claim 1, wherein the ground lead is separated from the signal lead.

3. The high-frequency package of claim 1, wherein a top surface of the ground lead and a top surface of the signal lead is at a same level.

4. The high-frequency package of claim 1, wherein the ground lead comprises a first ground segment and a second ground segment, and the first ground segment and the second ground segment are connected to the ground of the die and surround the signal lead.

5. The high-frequency package of claim 1, wherein the ground lead and the signal lead perform as a transmission line.

6. The high-frequency package of claim 5, wherein the signal lead comprises at least a protrusion, and the at least a protrusion protrudes from a central portion of the signal lead and forms capacitance of the transmission line.

7. The high-frequency package of claim 1, further comprising:
    a first bonding wire, connecting the die and the ground lead; and
    at least a second bonding wire, connecting the die and the signal lead;
    wherein the first bonding wire and the at least a second bonding wire form as a ground-signal-ground structure.

* * * * *